United States Patent [19]

Tavana et al.

[11] Patent Number: 5,825,202

[45] Date of Patent: Oct. 20, 1998

[54] INTEGRATED CIRCUIT WITH FIELD PROGRAMMABLE AND APPLICATION SPECIFIC LOGIC AREAS

[75] Inventors: Danesh Tavana, Mountain View; Wilson K. Yee, Pleasanton; Stephen M. Trimberger, San Jose, all of Calif.

[73] Assignee: Xilinx, Inc., San Jose, Calif.

[21] Appl. No.: 721,392

[22] Filed: Sep. 26, 1996

[51] Int. Cl.[6] .......................... H03K 7/38; H03K 19/177
[52] U.S. Cl. ................................................ 326/39; 326/41
[58] Field of Search ......................................... 326/39, 41

[56] References Cited

U.S. PATENT DOCUMENTS

| | | |
|---|---|---|
| 4,706,216 | 11/1987 | Carter . |
| 5,068,603 | 11/1991 | Mahoney . |
| 5,550,839 | 8/1996 | Buch et al. . |
| 5,682,106 | 10/1997 | Cox et al. ................................... 326/39 |
| 5,687,325 | 11/1997 | Chang ........................................ 326/39 |

OTHER PUBLICATIONS

XC2000 Logic Cell Array, Xilinx Data Book, 1994, pp. 2–185 to 2–228.

*Primary Examiner*—Michael J. Tokar
*Assistant Examiner*—Richard Roseen
*Attorney, Agent, or Firm*—Edel M. Young; Adam H. Tachner; Lois D. Cartier

[57] ABSTRACT

A heterogeneous integrated circuit device comprising a field programmable gate array (FPGA) programmably connected to a mask-defined application specific logic area (ASLA) on an integrated circuit thus providing a flexible low cost alternative to a homogeneous device of one type or the other. By integrating both on a single monolithic IC, the user benefits from both low cost and flexibility. Routing of signals between gate arrays and between the gate arrays and input/output (I/O) circuits is also implemented as a combination of mask-defined and programmably-configured interconnections.

20 Claims, 8 Drawing Sheets

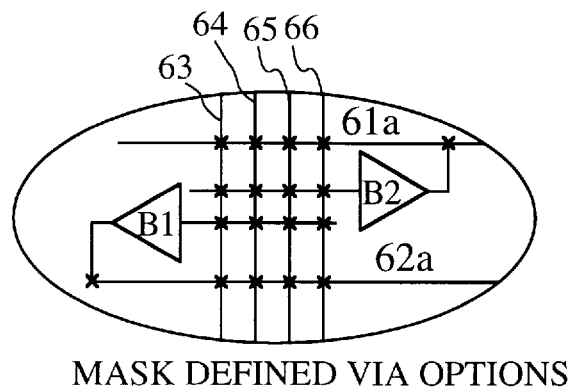
MASK DEFINED VIA OPTIONS
FIG. 7
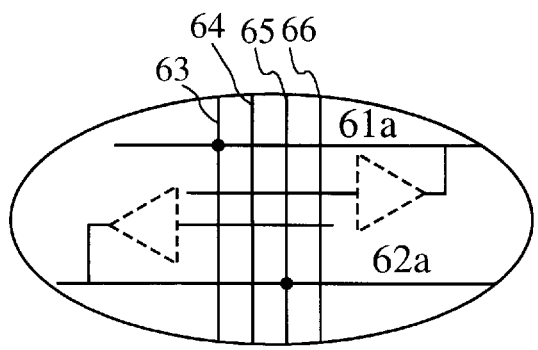
FIG. 7a
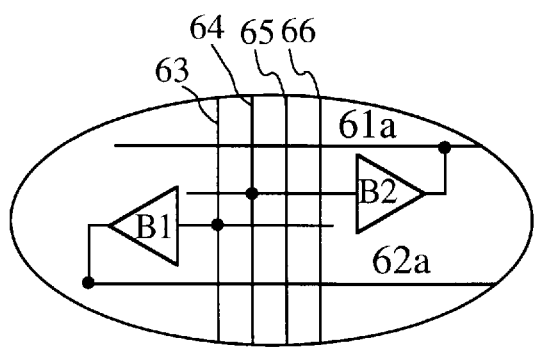
FIG. 7b
FIG. 9
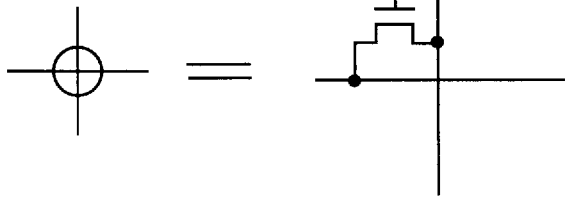

INTEGRATED CIRCUIT WITH FIELD PROGRAMMABLE AND APPLICATION SPECIFIC LOGIC AREAS

FIELD OF THE INVENTION

This invention relates to a structure and method for performing custom logic functions in an integrated circuit logic device.

DESCRIPTION OF THE BACKGROUND ART

Advancements in the technology of integrated circuits have enabled designers to place relatively large numbers of digital logic gates as an array on a single integrated circuit chip (IC). Numerous approaches have evolved for interconnecting the logic gates of such high density, digital logic ICs.

A first approach, which may be described by terms such as hard-wired interconnection, metal interconnection, etc. and is referred to herein as mask-defined, uses the fixed layout of various conductive paths in the IC that are either diffused in the substrate or patterned in metallization layers of the IC to interconnect input and output terminals of logic gates, one to the next. As integrated circuit devices have become able to perform more functions within a single integrated circuit chip, the manufacturers of integrated circuit chips have developed ways of automatically and quickly responding to orders for custom chips to perform specific functions for specific applications.

Mask programmed gate array manufacturers apply custom metallization layers as a final step in a standard manufacturing process in order to connect transistors located within a semiconductor substrate to perform a particular logic function ordered by a customer. Manufacturers also provide fully custom integrated circuit devices in which the entire layout of the chip is selected to meet the needs of the customer. The terms "MPGA" and "ASIC" (application specific integrated circuit) are used in the industry to refer to integrated circuit devices for which the design is completed before manufacturing is completed and the IC is not programmable later. For the customer with a finalized design intended for long term, large volume production, custom metallization or full custom design can be an excellent choice. On the other hand, for customers who make frequent design changes, who want only small numbers of identical devices, or who may not yet have fully tested a new design and remain in the early stages of a product's life cycle, field programmable integrated circuit chips are available. In one form of a field programmable chip, there are many pass transistors which can be turned on or off to connect or not connect corresponding lines to logic circuits, to other lines, or to input/output pads. By turning on the proper combination of pass transistors and connecting the proper set of lines, a user can obtain a desired function. The user can reprogram a different design into the chip by turning on different combinations of pass transistors. In another form of programmable chip, interconnection of metal lines can be achieved through a field programmable via connection typically known as an antifuse.

The field programmable approach loses its advantage over the mask-defined approach in later phases of a product's life cycle when demand for the product grows, uncertainty about the design disappears, and chips need to be produced in relatively large volumes (i.e., 10,000 units or more). The total cost of the chip at such a point in its life cycle tends to be greater when the chip is a field programmable IC rather than a mask-defined chip. One reason field programmable chips have larger overall cost is that the memory cells and pass transistors in field programmable chips consume large amounts of space compared to the simple metal process used in mask-defined chips.

Xilinx, Inc., the assignee of the present invention, manufactures field programmable gate arrays or FPGAS. A Xilinx FPGA includes an array of logic blocks, each of which can be configured to perform a desired logic function (each logic block combining multiple AND, OR, MUX gates, or FLIP-FLOPs for example). The Xilinx FPGA also includes interconnect lines which can be programmed to interconnect individual logic blocks to achieve the overall complex logic function provided by the entire chip. In the current Xilinx products, two kinds of configurable blocks are used in an FPGA. Around the perimeter of the chip, and connected to each of the external pins are input/output logic blocks which can be programmed to connect input buffers or output buffers to the pin and to perform some logic functions. In the interior of the chip are logic blocks which offer user definable logic functions.

FIG. 1 shows the top left corner of an FPGA. Configurable input/output blocks I01 through I015 are shown. Configurable logic blocks CLB11–CLB14; CLB21–CLB24; CLB31–CLB34; and CLB41–CLB44 are shown. Each of the configurable blocks can be programmed to implement a plurality of logic gates such as AND, OR, XOR, INVERT, mixed combinational functions, and MUX as well as tristate buffers and FLIP-FLOPs and can be combined to implement a plurality of more complex logic functions.

One type of logic block includes a look-up table which is programmed to provide a desired function of several input signals. By loading memory cells of a look-up table with the truth table of a desired logic function, any logic function of its input signals is obtained. This block gives great flexibility with minimal signal delay.

These configurable blocks each have input and output leads for receiving input signals and providing output signals. These leads are shown in FIG. 1 as short lines extending outward from each of the blocks and not connected to other portions of the array. An interconnect structure not shown in FIG. 1 is also present, and can be programmed to connect these short lines to each other. The configurable logic array chip also has a configuration structure not shown in FIG. 1 for programming the particular logic function or loading a truth table. Loading memory cells in the configuration structure determines what logic function will be applied by the block to signals on its input leads to generate a signal on its output lead or leads. These logic blocks are discussed in U.S. Pat. No. 4,706,216 issued Nov. 10, 1987, which is incorporated herein by reference.

While FPGA designs such as the one illustrated in FIG. 1 are highly configurable, there remains a need in the industry for less expensive programmable chips with higher equivalent logic gate density per area of silicon. While purely programmable devices are becoming less expensive than they were, if large numbers of devices are needed and the design is fixed and well-known, mask-defined chips are still less expensive than field programmable devices of equivalent gate count. To accommodate a nearly completed design and the remaining evolution of the design to final stage wide spread distribution, there is, accordingly, a need in the industry for a device which allows for inexpensive large scale production of customized chips while permitting the user a limited form of post-fabrication modification of the design.

SUMMARY OF THE INVENTION

Given the design convenience and flexibility of FPGAs and the high-volume cost advantages of mask-defined application specific devices, it would benefit users to combine the advantages of both device types into a single architecture. Such a combination is attractive to gate array users who are not quite settled on a part of their design and currently must redo mask sets to implement even the smallest change to their design.

According to the invention, an integrated circuit device is provided having a field programmable gate array (FPGA) portion and a mask-defined application-specific logic area (ASLA). The field programmable FPGA section of the combined chip provides redesign flexibility and the mask-defined ASLA section reduces cost and renders the entire monolithic integrated circuit device more suitable for high volume production.

Such a combination provides sufficient flexibility to make design corrections, such as after beta testing, without incurring the high cost of re-fabricating the mask-defined chip. Thus for example, if a beta testing program reveals a logic anomaly in an otherwise properly configured IC device, the ability to reprogram the FPGA portion of a combined FPGA/ASLA architecture, could correct the anomaly at no additional cost. The advantages of having field programming in the FPGA portion of a combined FPGA/ASLA architecture, can also be beneficial where intentional design changes are needed to meet changed performance requirements or new industry standards. Furthermore, by providing a monolithic integrated circuit device having a portion which is field-programmable, proprietary designs may be more readily kept secret since systems can be manufactured and even sold without the FPGA portion programmed. The FPGA portion containing the proprietary design may be programmed at a later time and place at the discretion of the user.

It is therefore a primary advantage of the present invention to integrate in a single novel structure, a mask-defined or otherwise permanent custom chip architecture with an FPGA device having a field-programmable architecture. Both device types share the same fabrication process and are therefore compatible for integration on a single chip.

The resulting device allows for post-fabrication design modification, accelerated modification of the FPGA portion, combined with the decreased cost of the mask-defined portion.

The new device presents increased flexibility to the device user, improved configuration ability in the FPGA segment of the design, and allows for full and inexpensive integration of features during usage.

To achieve the above-listed advantages, the present invention provides a monolithic integrated circuit comprising an array of field programmable gates selectively interconnected by programmable switch matrices, the gates and the switch matrices being selectively programmable after manufacture in accordance with desired gate functions and connection relationships, an array of mask-defined gates having permanent customized functions and connection relationships, a plurality of input/output pads providing externally accessible signal connections to the arrays of programmable gates and mask-defined gates, and a plurality of first interconnections between the arrays of programmable gates and mask-defined gates, the first interconnections comprising arrays of programmable and mask-defined interconnections.

OBJECTS OF THE INVENTION

It is therefore a principal object of the present invention to provide a unique architecture for a unitary integrated circuit device in which a field programmable gate array is combined with a mask-defined gate array.

It is another object of the invention to provide a combined FPGA/ASLA on a single monolithic IC device to realize the reconfigurability of FPGAs and the low cost of ASLA's.

It is another object of the invention to provide both FPGA and ASLA features on a single integrated circuit as well as appropriate interconnection and routing between such features and to input/output pads.

It is still another object of the invention to provide a unitary, integrated circuit logic architecture wherein both field programmable logic and mask defined logic are available and wherein both field programmable routing and mask defined routing are available to interconnect logic circuits to input/output pads.

It is still another object of the invention to provide a monolithic IC having FPGA and mask-defined gate array portions wherein on-chip interconnection combines field programmable routing and mask-defined routing to interconnect such portions to each other and to I/O pads.

BRIEF DESCRIPTION OF THE DRAWINGS

The aforementioned objects and advantages of the present invention, as well as additional objects and advantages thereof will be more fully understood hereinafter as a result of a detailed description of a preferred embodiment when taken in conjunction with the accompanying drawings in which:

FIGS. 7, 7a, and 7b are enlarged portions of the modified routing of FIG. 6;

FIG. 9 is an explanatory drawing indicating the circuit definition of a symbol used in FIG. 8.

DETAILED DESCRIPTION OF A PREFERRED EMBODIMENT

The following description constitutes a disclosure of the best mode of the invention presently contemplated by the inventors. It is intended to be merely illustrative of an integrated circuit architecture embodying the invention without limiting the scope of protection afforded by applicable patent law.

Figure 1:
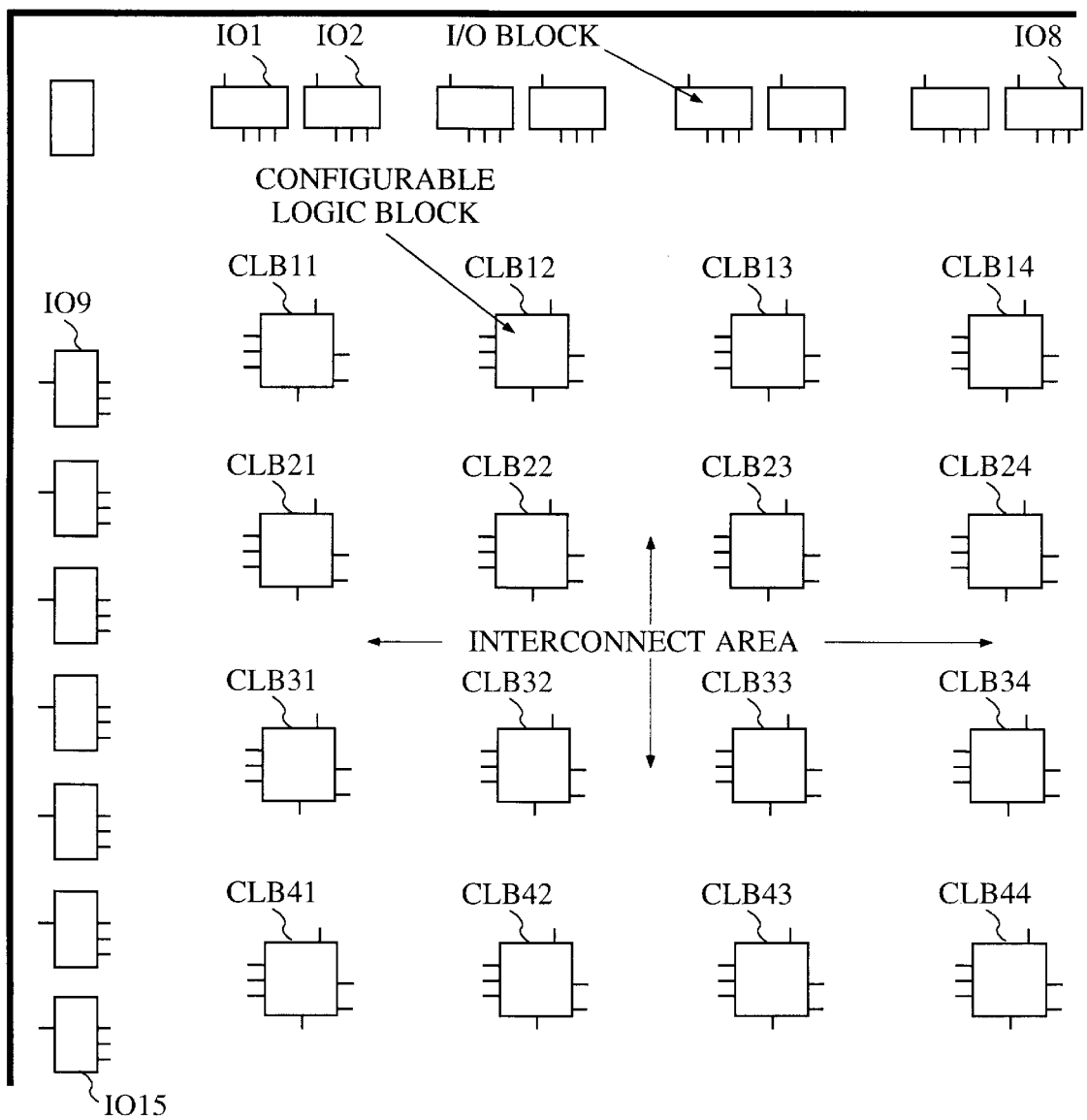
FIG. 1 is a block diagram of a prior art FPGA logic cell array structure.
Figure 2:
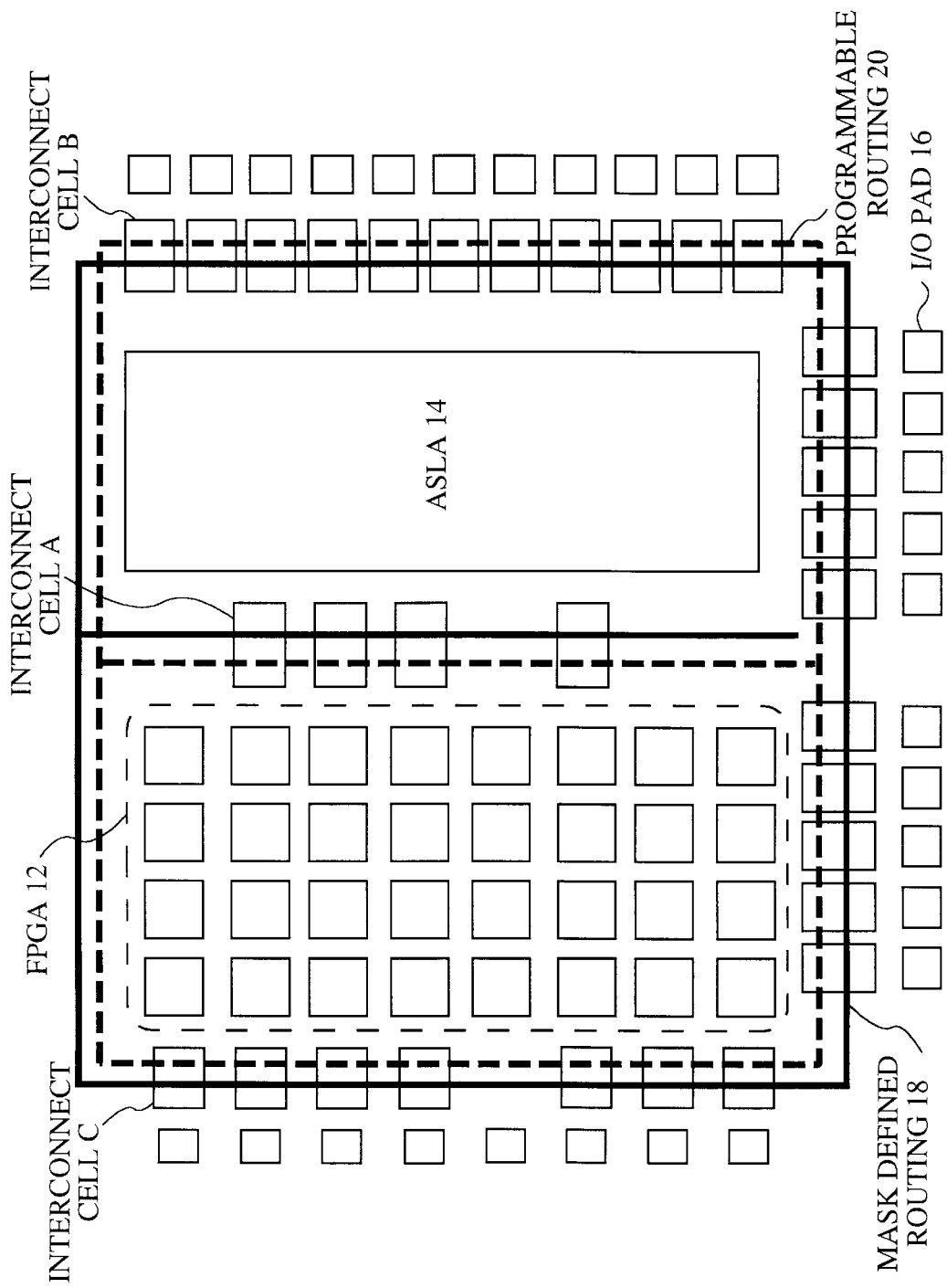
FIG. 2 is a block diagram of a combined FPGA and ASLA integrated circuit architecture in accordance with the present invention.

Referring first to FIG. 2, it will be seen that the preferred embodiment of a monolithic circuit device 10 in accordance with the present invention comprises an FPGA portion 12 or array of programmable gates and an ASLA portion 14 or array of mask-defined gates. Device 10 also comprises a plurality of input/output (I/O) pads 16 providing externally accessible signal connections to the respective arrays 12 and 14. ASLA 14 may comprise a hard-wired version of an earlier FPGA such as described by Buch et al. in U.S. Pat. No. 5,550,839, may comprise a standard cell array with customized metal layers such as manufactured by LSI Logic, Inc., or may comprise a custom logic device in which all masks of the device are selected by a customer. The ASLA portion is not intended to represent portions of an FPGA device such as clock buffers, oscillators, power-on reset circuits, JTAG circuits, or other such circuits that are typically provided to support the logic operation of an FPGA integrated circuit device.

As shown further in FIG. 2, the arrays 12 and 14 are surrounded by two distinct forms of routing, namely, mask-defined routing 18 and programmable routing 20. The routing of signals between the arrays as well as between the I/O pads and the arrays, is provided both as mask-defined and field-programmable interconnections. The details of routing 18 and 20, as well as further detail of the FPGA and I/O pad portions of the invention, will be discussed herein in conjunction with FIG. 3 to FIG. 8. In general however, it will be understood that the respective fractions of surface area of an integrated circuit device devoted to the FPGA portion 12, to the ASLA portion 14, to I/O pads 16 and to routing 18 and 20, may be readily modified as compared to the respective fractions shown in FIG. 2. More specifically, it would be relatively simple to fabricate the device 10 to either increase or decrease the number of gates in the FPGA 12 so that the relative surface area occupied by FPGA 12 is either more than or less than the proportion illustrated in FIG. 2.

Figure 3:
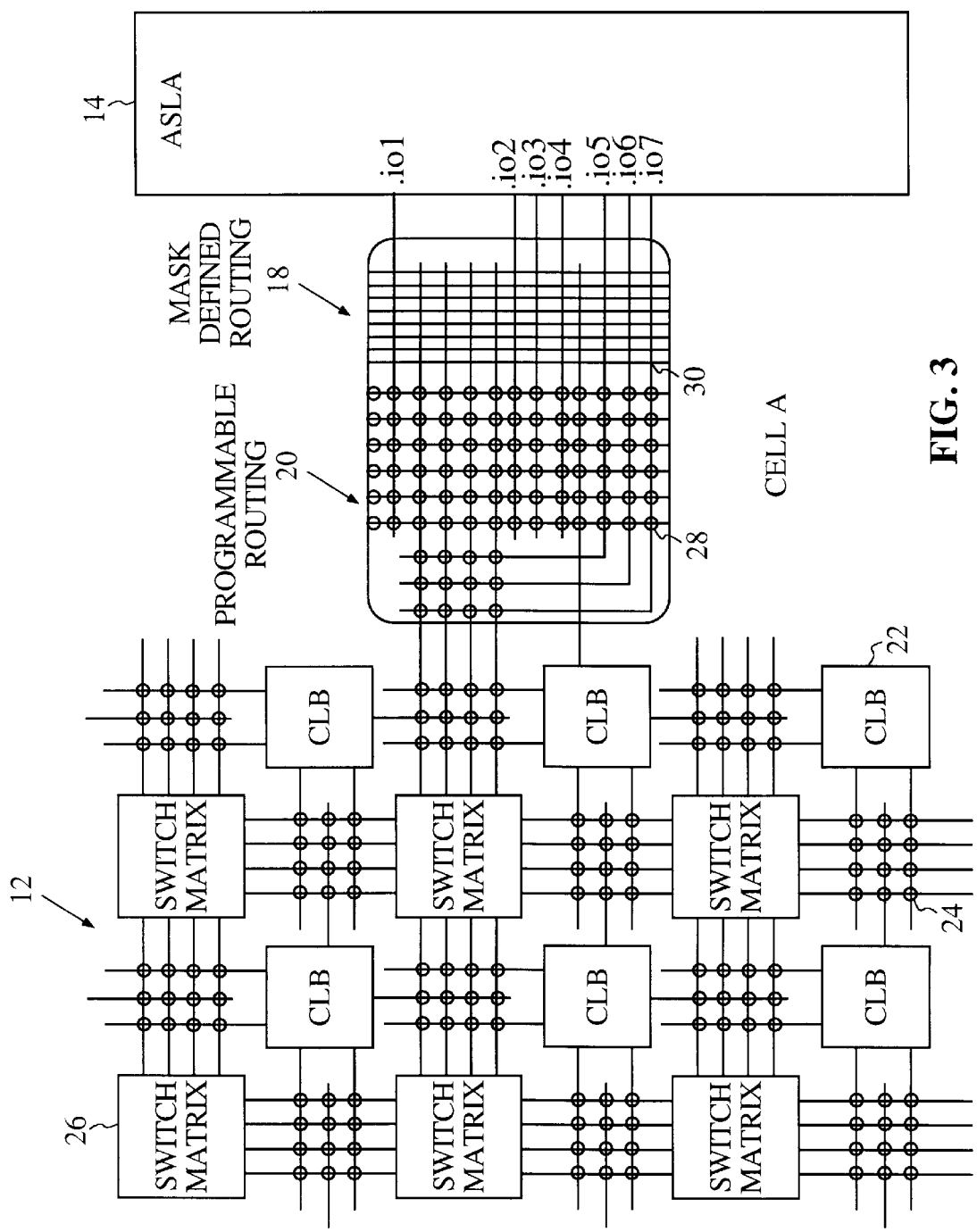
FIG. 3 is a more detailed view of a portion of the architecture of FIG. 2 illustrating the routing interconnection between the FPGA portion and the ASLA portion of the inventive architecture.

Referring now to FIG. 3, it will be seen that the FPGA 12 comprises a plurality of configurable logic blocks (CLBs) 22 each shown with six input/output leads. Each CLB 22 is intended to represent a generic programmable logic device and accordingly, the actual number of inputs and outputs may be altered to accommodate user preferences. For example, each CLB may be the equivalent of a configurable logic block of the XILINX XC 2000 Logic Cell Array products described at pages 2–185 through 2–228 of The Programmable Logic Data Book published by Xilinx in 1994, the content of which is hereby incorporated by reference. Each such CLB provides the functional elements from which the FPGA portion of the design is constructed. The disclosed FPGA 12 comprises a large plurality of such CLBs 22, the actual number depending upon the needs of the user and the degree of post-fabrication programming flexibility that may be needed or desired. The switch matrices 26 can selectively connect any routing signal to any other routing signal connected to its input/output terminals. In practice, it is sufficient and more cost effective to implement a switch matrix wherein each line can be selectively connected to a lesser number of other lines (i.e., 3) of the switch matrix to effect a limited degree of selective routing between CLBs or between CLBs and routing 18 or 20.

The mask-defined gate array or ASLA 14 is shown blank in FIG. 3. This is done intentionally to signify that, as in typical mask-defined ASLAs, the gate functions, configurations, and positions are entirely selectable prior to "freezing" the design for fabrication. By way of example, the ASLA 14 may be a mask-defined equivalent of an FPGA such as disclosed for a full integrated circuit in U.S. Pat. No. 5,068,603 (also assigned to XILINX) which has been permanently configured from a user's prior proven design or product and which can be safely mask-defined.

Figure 4:
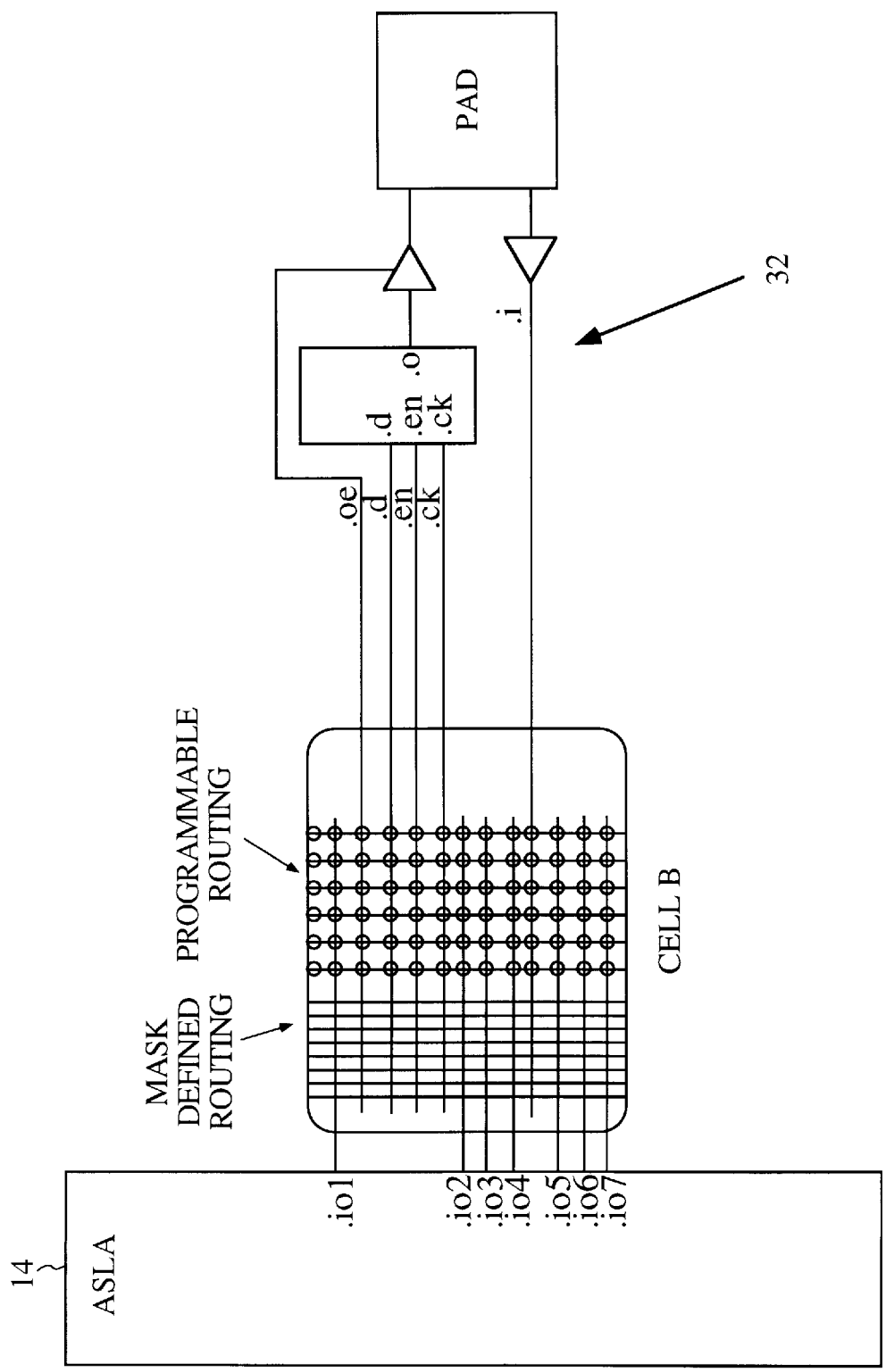
FIG. 4 is a more detailed view of another portion of the circuit of FIG. 2 showing the routing interface between the ASLA and the I/O block of the inventive chip.
Figure 5:
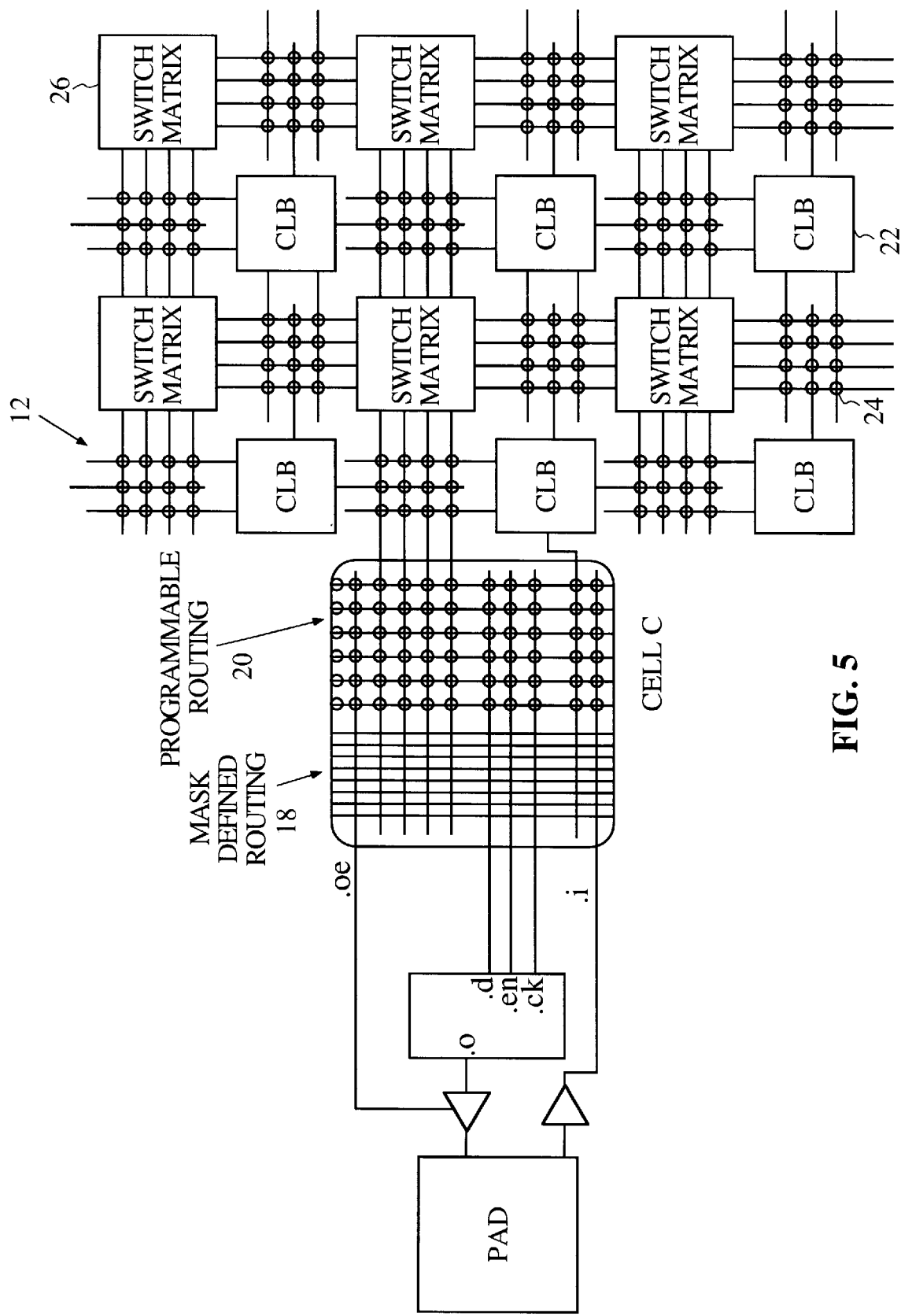
FIG. 5 is similar to that of FIG. 4 but illustrating the routing interface between the FPGA portion and I/O block of the inventive chip.

The routing that is used in the preferred embodiment of the invention to interconnect FPGA 12, ASLA 14 and I/O pads 16 is shown in FIG. 3 to FIG. 5 as cells A, B and C. Cells A, B and C are shown for purposes of clarity only and merely demonstrate the selected configuration of routing at respective locations A, B and C shown as rectangular regions in FIG. 2. The routing in the preferred embodiment is actually continuous around each array 12 and 14 as depicted in FIG. 2.

As shown in FIG. 3 to FIG. 5, the routing comprises a first matrix of programmable interconnects 28 (programmable for example by turning on transistors at programmable interconnect points known as PIPs) and a second matrix of mask-defined interconnections 30. Each such matrix 28 and 30 comprises a plurality of intersecting rows and columns of electrically conductive paths. As used herein the term "column" means a path along the direction of the signal lines surrounding the respective structure, and the term "row" means a path perpendicular to this direction, irrespective of vertical or horizontal orientation.

In the mask-defined routing 18, selected intersections between rows and columns are permanently connected while in the field programmable routing 20, the intersections are reprogrammable. The preferred routing configuration for CELL A of FIG. 2 is shown in detail in FIG. 31 while CELL B is shown in FIG. 4 and CELL C is shown in FIG. 5. The number of rows and columns may differ, but the general routing concept for interconnecting FPGA 12 and ASLA 14 (FIG. 3) with each other or with I/O pads 16 (FIGS. 4 and 5) is represented by these three figures.

As shown in FIGS. 4 and 5, associated with each I/O pad 16 there is an I/O block 32 which comprises a pair of oppositely directed tri-state buffers and a D-type flip-flop. The flip-flop may be used to control the timing of the output signal by means of a clock signal applied to the flip-flop.

Figure 6:
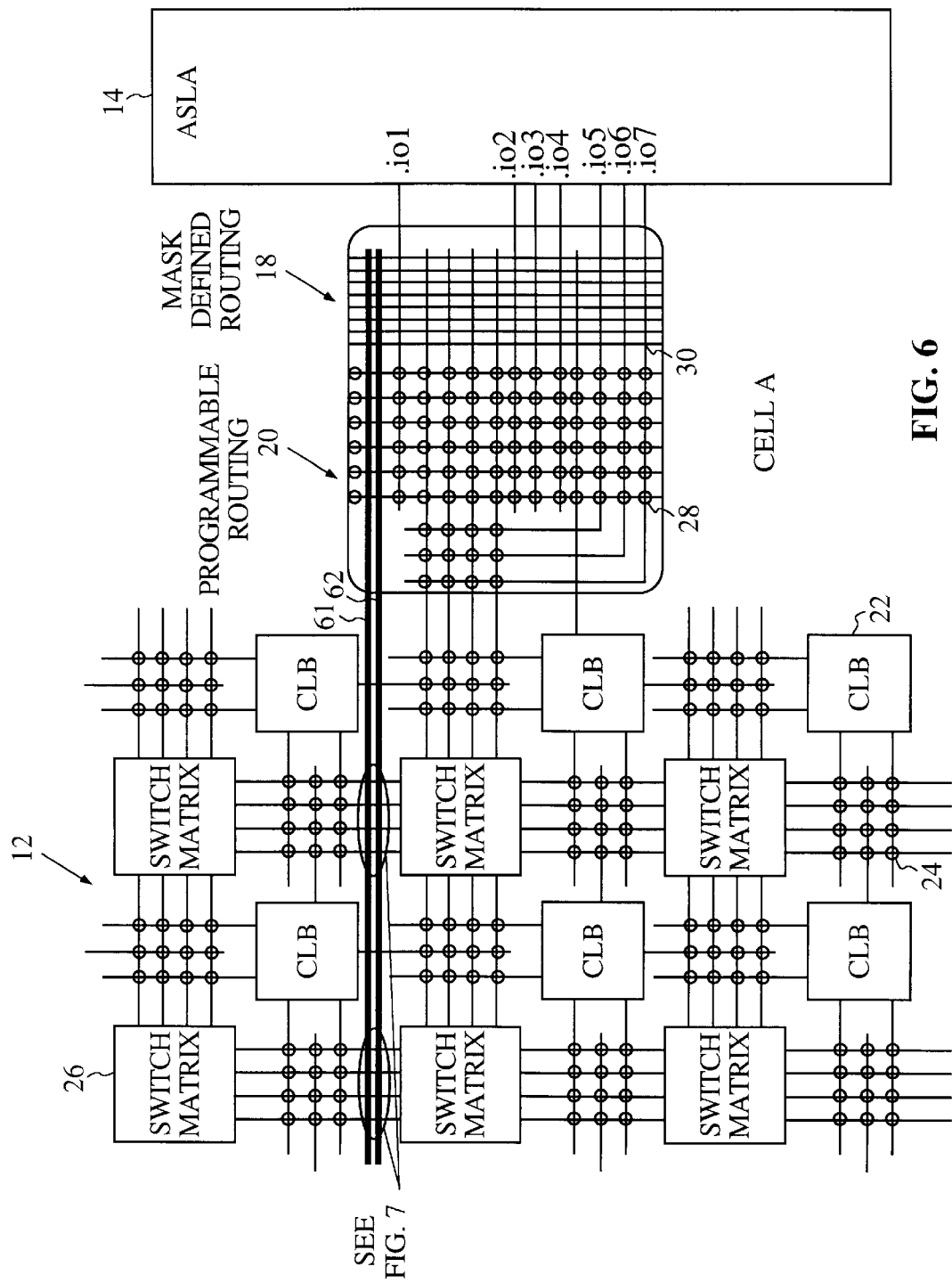
FIG. 6 is a block diagram similar to that of FIG. 3 but illustrating a modified routing interface.

FIG. 6 illustrates the use of special long lines for special signals requiring a minimum of delay or skew (delay variation). Connections from CELL A to these long lines are mask-defined in the preferred embodiment. Furthermore, as shown in FIG. 7, connection from switch matrices to the long lines may be selectively implemented with mask-defined via holes or metal lines. Numerals 61 and 62 represent groups of long lines extending across several columns of local interconnect lines of the FPGA portion of the device. For simplicity, only two lines 61a and 62a are illustrated in FIG. 7. The x's at intersections in FIG. 7 illustrate potential mask-defined connections that can be made between these long lines and local FPGA interconnect lines 63 through 66. FIG. 7a illustrates an option selected by the designer and implemented by selecting a mask pattern. In FIG. 7a, no use is made of buffers B1 and B2. Long line 61a is connected to FPGA local interconnect line 63, and long line 62a is connected to FPGA local interconnect line 65 by forming vias at the respective intersections. If long lines 61a and 62a are driven by ASLA 14, a properly sized buffer in ASLA 14 will have sufficient strength to drive the low skew, low delay, long line across the length of the long line (which may be nearly the length of the chip). In FIG. 7b, a connection is made from FPGA local line 63 through buffer B1 to long line 62a and a connection is made from FPGA local line 64 through buffer B2 to long line 61a. These connections are selected by the designer to connect to input ports of the designer's ASLA 14 through mask defined routing 18. The sizes of buffers B1 and B2 are selected to be sufficient to drive structures in ASLA 14 with a low skew signal.

Figure 8:
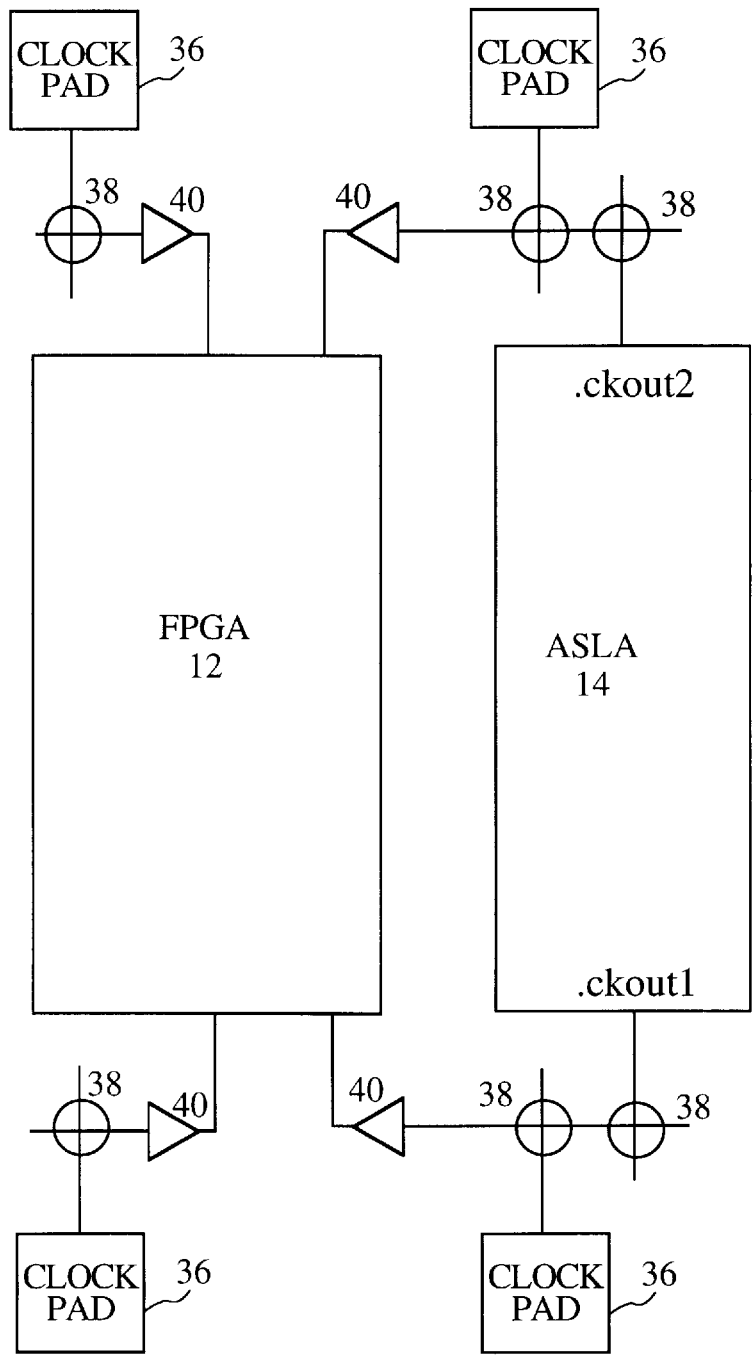
FIG. 8 is a block diagram of the clock signal connections employed in a preferred embodiment of the invention.

Turning to FIG. 8, it will be seen that the preferred embodiment of the present invention employs dedicated clock pads 36 to which up to four distinct clock signals may be applied with field-programmable interconnect points 38 and buffers 40. The circuit corresponding to the interconnect points 38 is shown in FIG. 9 where it is seen that a flip-flop (or latch) and transistor switch provide a selectable interconnect between two intersecting conductive lines.

It will now be apparent that what has been disclosed herein comprises a novel architecture of a monolithic integrated circuit device wherein a portion of the device is configured as a field-configurable FPGA and a portion is configured as a mask-defined ASLA, both portions providing arrays of gates interconnected by routing that also provides both field-configurable and mask-defined interconnections.

As a result of the disclosure herein of a preferred embodiment, those having skill in the relevant art will now perceive various additions and modifications which may be made to the invention without deviating from the principal teachings thereof. For example, the number of gates in each array, the manner of their interconnection and the general layout of the device may all be altered without diminishing the advantages of a monolithic device having a combined FPGA and ASLA configuration. For another example, although the field-configurable and mask defined structures are represented as being in separate locations, they may be laid out so as to inter-digitate. Accordingly, all such modifications and additions are deemed to be within the scope of protection afforded hereby which is limited only by the appended claims and their equivalents.

What is claimed is:

1. A monolithic integrated circuit comprising:
   an array of field programmable gates selectively interconnected by programmable switch matrices, said gates and said switch matrices being selectively programmable after manufacture in accordance with desired gate functions and connection relationships;
   an array of mask-defined gates having permanent customized functions and connection relationships;
   a plurality of input/output pads providing externally accessible signal connections to said arrays of programmable gates and mask-defined gates; and
   a plurality of first interconnections between said arrays of programmable gates and mask-defined gates, said first interconnect ions comprising arrays of programmable and mask-defined interconnections.

2. The integrated circuit recited in claim 1 wherein said plurality of first interconnections comprises a first matrix of field programmable interconnections and a second matrix of mask-defined permanent interconnections, said first matrix and said second matrix each having a plurality of selectable intersecting rows and columns of electrically conductive paths, the respective rows of said first matrix being connected to corresponding rows of said second matrix.

3. The integrated circuit recited in claim 1 further comprising a plurality of second interconnections between said array of programmable gates and a portion of said plurality of input/output pads.

4. The integrated circuit recited in claim 3 wherein said plurality of second interconnections comprises a first matrix of field programmable interconnections and a second matrix of mask-defined permanent interconnections, said first matrix and said second matrix each having a plurality of selectably intersecting rows and columns of electrically conductive paths, the respective rows of said first matrix being connected to corresponding rows of said second matrix.

5. The integrated circuit recited in claim 1 further comprising a plurality of third interconnections between said array of mask-defined gates and a portion of said plurality of input/output pads.

6. The integrated circuit recited in claim 5 wherein said plurality of third interconnections comprises a first matrix of field programmable interconnections and a second matrix of mask-defined permanent interconnections, said first matrix and said second matrix each having a plurality of selectably intersecting rows and columns of electrically conductive paths, the respective rows of said first matrix being connected to corresponding rows of said second matrix.

7. The integrated circuit recited in claim 1 further comprising a plurality of clock pads providing externally accessible clock connections to said arrays of programmable gates and mask-defined gates.

8. The integrated circuit recited in claim 7 wherein at least one of said clock pads is programmably connectable to both of said arrays.

9. The integrated circuit recited in claim 1 wherein said plurality of first interconnections between said arrays of programmable gates and said mask-defined gates comprises a plurality of long lines extending past more than one of said field programmable gates and connected to at least one of said switch matrices.

10. The integrated circuit of claim 1 wherein said plurality of first interconnections occupy integrated-circuit resources substantially separate from integrated-circuit resources occupied by said array of field programmable gates.

11. The integrated circuit of claim 3 wherein said plurality of second interconnections occupy integrated-circuit resources substantially separate from integrated-circuit resources occupied by said array of field programmable gates.

12. The integrated circuit of claim 5 wherein said plurality of third interconnections occupy integrated-circuit resources substantially separate from integrated-circuit resources occupied by said array of field programmable gates.

13. An integrated circuit chip comprising:
   a field-configured array of logic blocks having logic functions and being interconnected in accordance with user provided data which may be modified to alter the field-configured array of logic blocks to have different respective logic functions and interconnections;
   a mask-defined array of logic blocks having respective logic functions and being interconnected in accordance with selected metal masks which, once selected, cannot be modified; and
   an interconnect structure for connecting said field-configured array to said mask-defined array, said interconnect structure comprising arrays of field-configured and mask-defined interconnections.

14. The integrated circuit chip recited in claim 13 wherein each of said arrays occupies a respective distinct portion of said chip.

15. The integrated circuit chip recited in claim 13 wherein said interconnect structure comprises signal routing having a plurality of selectable interconnections, some of said interconnections being mask-defined and some of said interconnections being field selectable by programming.

16. The integrated circuit chip recited in claim 15 wherein said mask-defined interconnections and said field selectable interconnections comprise matrices configured as columns and rows.

17. An integrated circuit configured as a monolithic chip and comprising:
   a plurality of logic blocks the logic functions of which may be configured after packaging of said chip, said blocks being interconnected by configurable interconnects in the form of paths which may also be configured after packaging of said chip; and an array of mask-defined logic gates the logic functions of which are selected before packaging of said chip, said gates being interconnected by paths selected before packaging of said chip, said paths comprising an interconnect-element array;

said logic blocks and said gates being interconnected by paths at least some of which may be configured after packaging of said chip.

18. A method of fabricating an integrated circuit with field programmable and application specific logic areas, the method comprising the following steps:

a) providing an array of mask defined logic gates;

b) providing an array of field programmable logic gates;

c) programming unalterable logic functions of said mask defined logic gates;

d) providing a structure for programming alterable logic functions of said field programmable logic gates; and e) providing and programming arrays of field-configured and mask-defined interconnections between said mask defined logic gates and said field programmable logic gates.

19. A monolithic integrated circuit comprising:

an array of field programmable gates selectively interconnected by programmable switch matrices, said gates and said switch matrices being selectively programmable after manufacture in accordance with desired gate functions and connection relationships;

an array of mask-defined gates having permanent customized functions and connection relationships;

a plurality of input/output pads providing externally accessible signal connections to said arrays of programmable gates and mask-defined gates; and a plurality of first interconnections between said arrays of programmable gates and mask-defined gates, said first interconnections comprising programmable interconnections dedicated to the function of interconnecting the field programmable gates to the mask-defined gates.

20. An integrated circuit chip comprising:

a field-configured array of logic blocks having logic functions and being interconnected in accordance with user provided data which may be modified to alter the field-configured array of logic blocks to have different respective logic functions and interconnections;

a mask-defined array of logic blocks having respective logic functions and being interconnected in accordance with selected metal masks which, once selected, cannot be modified; and an interconnect structure for connecting said field-configured array to said mask-defined array, said interconnect structure comprising programmable interconnections dedicated to the function of interconnecting the field programmable gates to the mask-defined gates.

* * * * *